United States Patent
Sato et al.

(10) Patent No.: US 6,700,197 B2
(45) Date of Patent: Mar. 2, 2004

(54) CLIP-ATTACHING STRUCTURE

(75) Inventors: Hidetoshi Sato, Shizuoka (JP); Koji Miyakoshi, Shizuoka (JP); Tsutomu Ishimaru, Hokkaido (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/315,097

(22) Filed: Dec. 10, 2002

(65) Prior Publication Data

US 2003/0143890 A1 Jul. 31, 2003

(30) Foreign Application Priority Data

Jan. 29, 2002 (JP) .................... 2002-020340

(51) Int. Cl.$^7$ ............................................. H01L 23/34
(52) U.S. Cl. ....................................... 257/727; 439/527
(58) Field of Search ................................. 439/533, 527; 257/718, 719, 727, 730

(56) References Cited

U.S. PATENT DOCUMENTS 6,400,572 B1 * 6/2002 Wu ............................. 361/704

FOREIGN PATENT DOCUMENTS

JP          5-205714          8/1993

* cited by examiner

Primary Examiner—Roy Potter
(74) Attorney, Agent, or Firm—Armstrong, Kratz, Quintos, Hanson & Brooks, LLP

(57) ABSTRACT

A clip-attaching structure is provided, which includes: an attachment body; a mating attachment body to which the attachment body is attached; and a clip provided, in accordance with an outer shape of the attachment body, with a baseplate, a first side plate extending from one side of the baseplate and having an engaging portion, and a second side plate extending from the other side of the baseplate, which clip fixing the attachment body to the mating attachment body, wherein an engagement portion to which the engaging portion engages is provided on the mating attachment body, and the attachment body is fixed to the mating attachment body by fixing the clip to the mating attachment body.

12 Claims, 4 Drawing Sheets

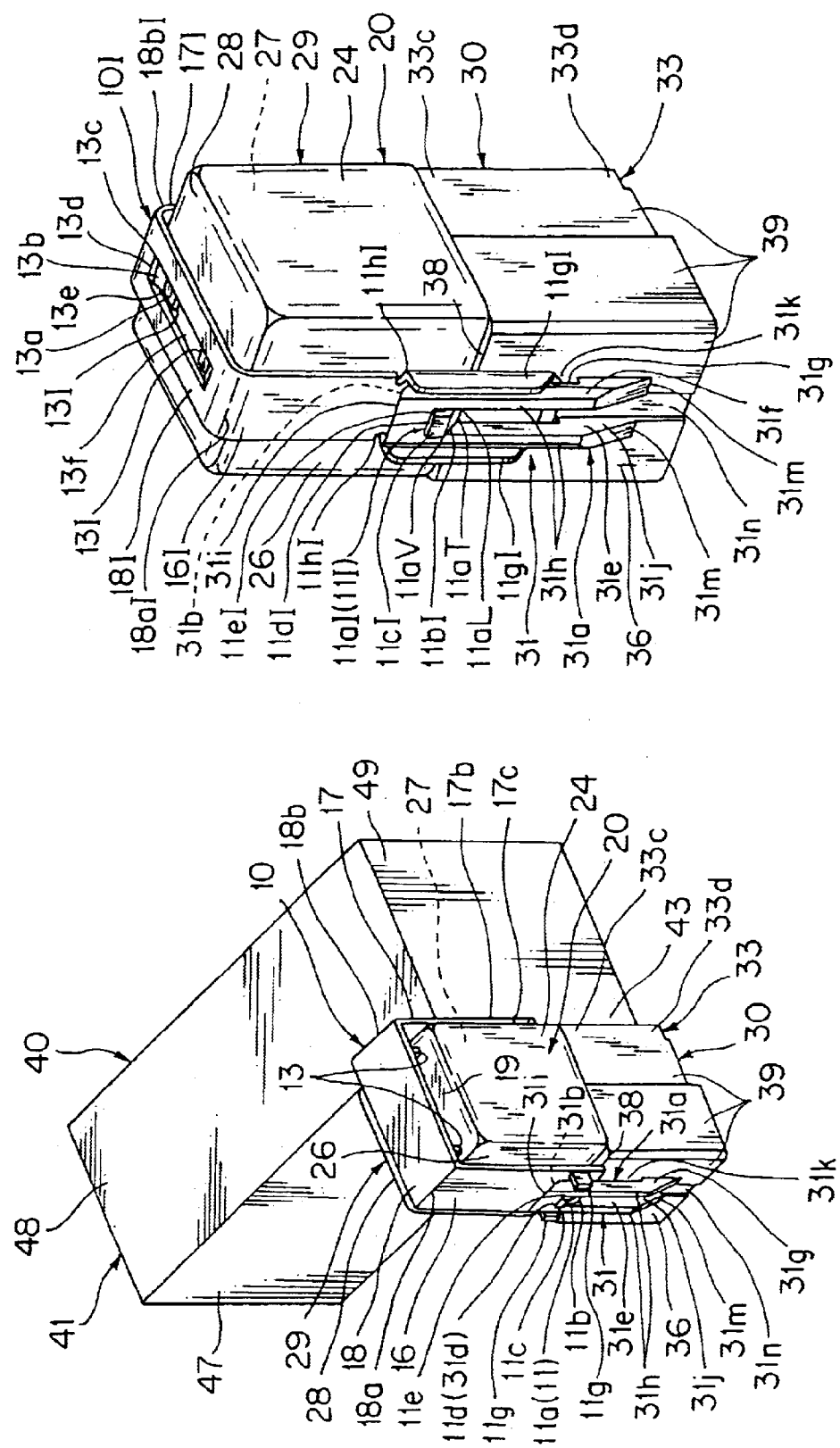

CLIP-ATTACHING STRUCTURE

BACKGROUND OF THE INVENTION

1. Field of the Invention

The present invention relates to a structure of attaching a relay to a housing provided on an upper cover of an electric junction box by using a clip with a vibration measures and a good attachability.

2. Description of the Related Art

FIG. 6 is a perspective view showing a prior art attaching structure of a battery band (Japanese Patent Application Laid-open No. 5-205714). A battery band 101 has a rubber band 101E to fix a battery 103 in a battery holder 104. This rubber band 101E has a face 101A and a face 101B. A spare fuse holding means 102 to hold a spare fuse 105 is formed on the face 101B of the rubber band 101E.

This spare fuse holding means 102 has a projecting portion 102A, a hole portion 102B in which the above spare fuse 105 is inserted, and a protruding portion 106 as a falling-off preventing mechanism for the spare fuse 105.

The above battery 103 is accommodated in a box-like battery holder 104. The battery band 101 extends between side face portions 104A of the battery holder 104, crossing a side face portion 103A of the battery 103.

A metal fitting 101D is provided on an end portion 101C. The metal fitting 101D engages an engaging portion 104B of the battery holder 104.

With respect to the above prior art of FIG. 6, however, the rubber band 101E is likely to be plastically extended due to the vibration of a motor vehicle in a ling time.

In such a case, the metal fitting 101D provided on the end portion 101C of the rubber band 101E could come off, and the battery 103 could fall out of the battery holder 104.

When the battery 103 is fixed in the battery holder 104, the battery band 101, i.e. the rubber band 101E, has to be fairly strongly extended. Therefore, such a work has been expected to be improved.

Further, in an electric junction box (not shown) having an attaching structure of a relay, because a shape or structure of a relay is different according to its manufacturer, a relay other than the specified one can not generally be attached to a housing to which the specified rely is attached.

Even if the unspecified relay can be attached to the above housing which is attached to an electric junction box, the unspecified relay is likely to fall out of the housing due to the vibration of a motor vehicle.

SUMMARY OF THE INVENTION

In view of the foregoing, an object of the present invention is to provided a clip-attaching structure wherein an attachment body such as a relay is not likely to come loose and fall out of a mating attachment body such as a housing even if the mating attachment body suffers vibration.

In order to achieve the above object, as a first aspect of the present invention, a clip-attaching structure comprises: an attachment body; a mating attachment body to which the attachment body is attached; and a clip provided, in accordance with an outer shape of the attachment body, with a baseplate, a first side plate extending from one side of the baseplate and having an engaging portion, and a second side plate extending from the other side of the baseplate, which clip fixing the attachment body to the mating attachment body, wherein an engagement portion to which the engaging portion engages is provided on the mating attachment body, and the attachment body is fixed to the mating attachment body by fixing the clip to the mating attachment body.

As a second aspect of the present invention, based on the first aspect, a rib for preventing a position divergence of the clip relative to the mating attachment body is provided on the first side plate of the clip.

As a third aspect of the present invention, based on the first aspect, the clip is provided with a dimension-difference absorbing portion for absorbing a dimensional difference between the attachment body and another attachment body when another attachment body having an outer dimension different from that of the attachment body is used in place of the attachment body.

As a fourth aspect of the present invention, based on the third aspect, the dimension-difference absorbing portion is formed as a spring portion which generates an elastic force when the dimension-difference absorbing portion is pressed against a wall of the attachment body.

As a fifth aspect of the present invention, based on the first aspect, a guide rib is provided on the mating attachment body, a second guide rib relative to the guide rib is provided on the second mating attachment body, and the second mating attachment body is attached to the mating attachment body with an engagement of the guide rib and the second guide rib.

As a sixth aspect of the present invention, based on the fifth aspect, the second mating attachment body is provided with a pair of second guide ribs, the second guide ribs serving as a guide portion to guide the second side plate extending from the baseplate of the clip.

As a seventh aspect of the present invention, based on the fifth aspect, a second engaging portion is provided on the second side plate of the clip, and a second engagement portion for the second engaging portion is provided on the second mating attachment body to which the clip is attached.

As an eighth aspect of the present invention, based on the first aspect, the clip is made of metal or resin.

As a ninth aspect of the present invention, based on the first aspect, the attachment body is a relay, and the mating attachment body is a housing formed on a cover of an electric junction box.

As a tenth aspect of the present invention, based on any one of the fifth to seventh aspects, the second mating attachment body is a second electric junction box.

According to the above-described structures of the present invention, the following advantages are provided.

(1) According to the first aspect of the invention, the attachment bodies with various shapes can be securely attached to the mating attachment body by using the clip, thereby providing the clip-attaching structure with an improved multiusability. The attachment body is securely attached to the mating attachment body by applying the clip after the attachment body is attached to the mating attachment body and by engaging the engaging portion of the clip with the engagement portion of the mating attachment body. Therefore, the clip-attaching structure with an improved attaching workability is provided.

(2) According to the second aspect of the invention, a position divergence of the clip with respect to the mating attachment body is prevented, whereby the clip is securely attached to the mating attachment body.

(3) According to the third aspect of the invention, the dimension-difference absorbing portion provided on the clip allows the attachment bodies with various shapes to be securely attached to the mating attachment body.

(4) According to the fourth aspect of the invention, the spring portion as the dimension-difference absorbing portion provided on the clip allows the attachment bodies with various shapes to be more securely attached to the mating attachment body, while attaining a better vibration measures.

(5) According to the fifth aspect of the invention, when the mating attachment body is attached to the second mating attachment body, the guide ribs provided on the mating attachment body engage the second guide ribs provided on the second mating attachment body, whereby the attaching work can be easy and securely carried out.

(6) According to the sixth aspect of the invention, the clip can be easily attached to the second mating attachment body by inserting the second side plate of the clip into the guide portion of the second mating attachment body.

(7) According to the seventh aspect of the invention, because the clip engages both the mating attachment body and the second mating attachment body, the clip is securely attached, while attaining a better vibration measures.

(8) According to the eighth aspect of the invention, the attachment body can be securely attached to the mating attachment body by the clip of metal or resin. The clip of metal or resin can be easily manufactured.

(9) According to the ninth aspect of the invention, the relay can be prevented from falling out of the housing formed on the cover of the electric junction box by means of the clip.

(10) According to the tenth aspect of the invention, the clip can be securely attached to the second electric junction box.

The above and other objects and features of the present invention will become more apparent from the following description taken in conjunction with the accompanying drawings.

BRIEF DESCRIPTION OF THE DRAWINGS

FIG. 3 is a perspective view showing a state that an attachment body is attached to a mating attachment body and the second mating attachment body by using the clip.

FIG. 5 is a perspective view showing a state that an attachment body is attached to a mating attachment body by using a clip.

DESCRIPTION OF THE PREFERRED EMBODIMENT(S)

Embodiment(s) of the present invention will now be described in further detail with reference to the accompanying drawings.

A housing 30 (FIG. 1, FIGS. 3–5) is formed on an upper cover (not shown) of an electric junction box, and a relay 20 is attached on the housing 30. Terminals 22a, 22b, 22c project downward from a basewall 23 of the relay 20.

Figure 4:
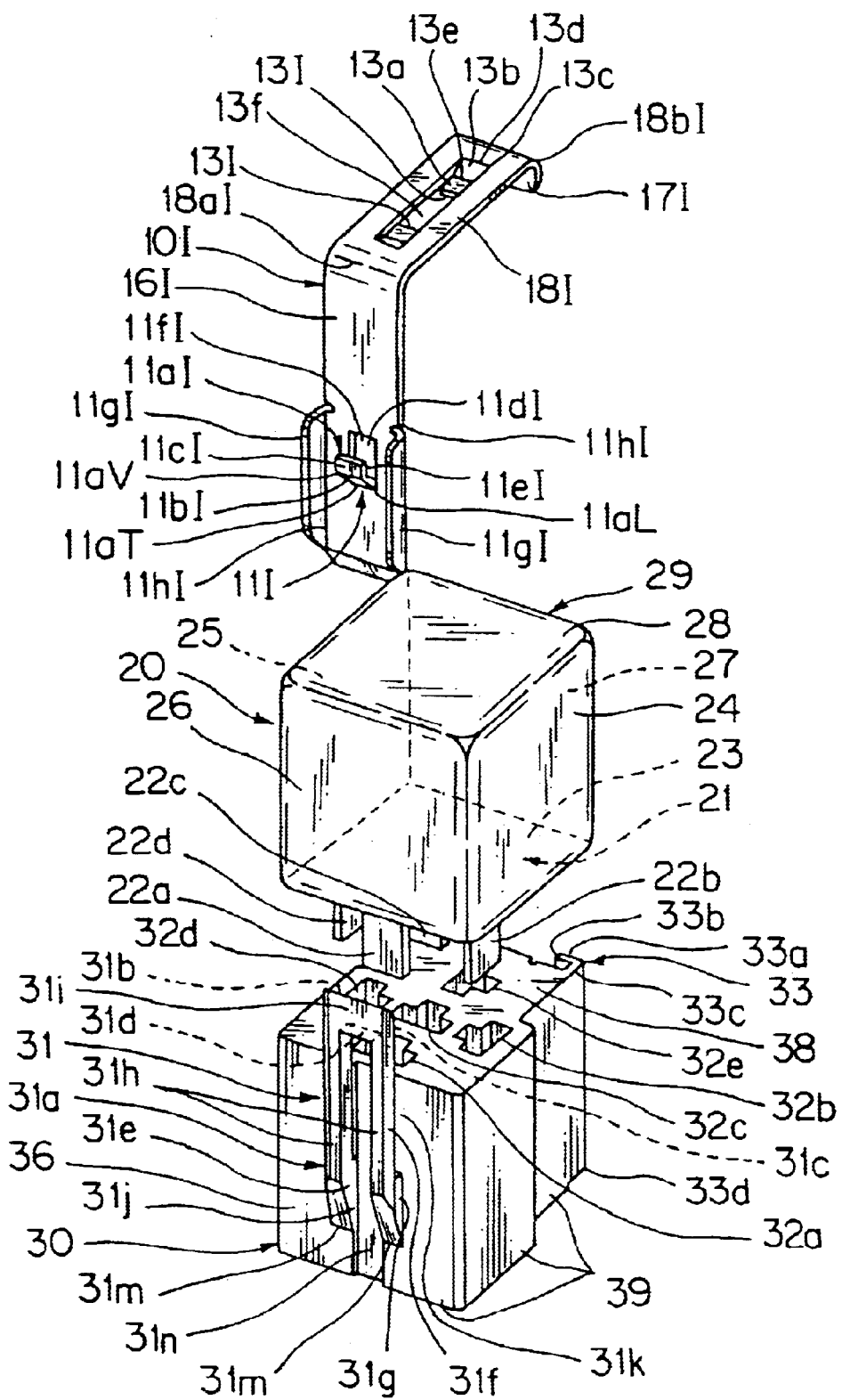
FIG. 4 is an exploded perspective view showing another embodiment of the inventive clip-attaching structure.

Hereinafter, common items in the embodiment of FIG. 1–FIG. 3 and another embodiment of FIG. 4–FIG. 5 are described together.

In the clip-attaching structure exemplified in the present specification, the relay 20 (FIG. 1, FIGS. 3–5) is used as the attachment body 20, and the housing 30 (FIG. 1, FIGS. 3–5) formed on the upper cover (not shown) of the electric junction box is used as the mating attachment body 30. A second electric junction box 40 (FIG. 1–FIG., 3) attached to the housing 30 is used as a second mating attachment body 40.

Figure 1:
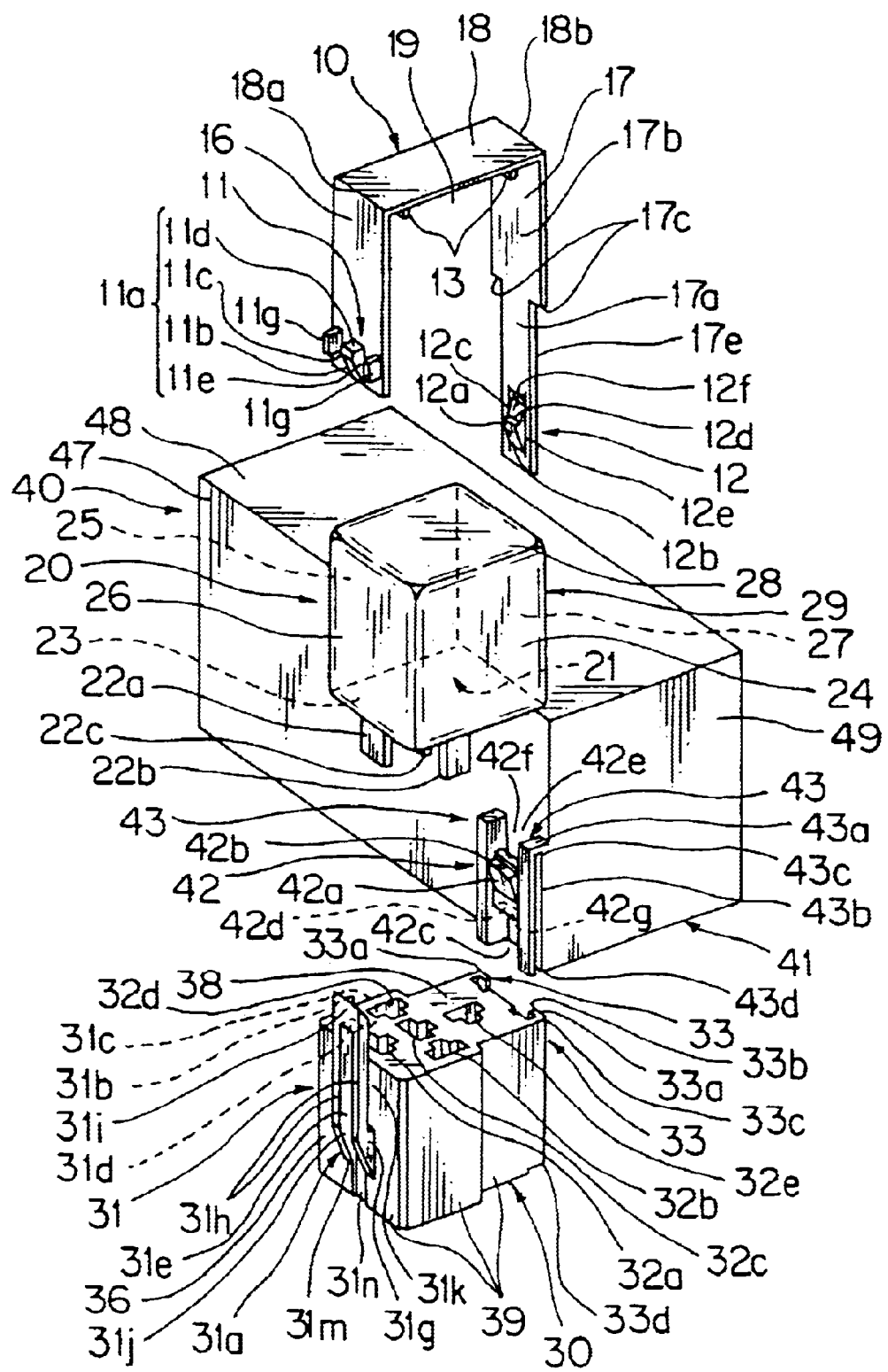
FIG. 1 is an exploded perspective view showing an embodiment of the inventive clip-attaching structure.

As shown in FIG. 1 and FIG. 4, the relay 20 has a body 21 having inside equipment (not shown) and a cover 29 protecting the inside equipment. The body 21 of the relay 20 has the inside equipment, a basewall 23 on which the inside equipment is installed, and the male terminals 22a, 22b, 22c, 22d (FIG. 4) electrically connected with the inside equipment and projecting downward from the basewall 23. A cover 29 attached to the body 21 of the relay 20 has a ceiling wall 28, a first side wall 26, a second side wall 27 and other sidewalls 24, 25 and has a box-like shape.

For the terminals 22a, 22b, 22c, 22d (FIG. 4) provided on the relay 20, terminal insertion openings 32a, 32b, 32c, 32d, 32e are provided on the ceiling wall 38 of the housing 30 as shown in FIG. 1 and FIG. 4. The insertion opening 32e is provided for a non-shown male terminal provided on the relay 20. F—F terminals (Female—Female terminals; not shown) are provided in a terminal accommodating chamber continuing from these terminal insertion openings 32a, 32b, 32c, 32d, 32e.

When the terminals 22a, 22b, 22c, 22d provided on the relay 20 are inserted in the insertion opening 32a, 32b, 32c, 32d of the housing 30 and are connected with the F—F terminals, whereby the relay 20 is attached to the housing 30.

As shown in FIG. 1–FIG. 5, this clip-attaching structure has the relay 20, the housing 30 formed on the upper cover of the electric junction box, and a clip 10 (FIG. 1–FIG. 3), 10I (FIGS. 4, 5) to fix the relay 20 and the housing 30.

The clip 10 (FIG. 1–FIG. 3), 10I (FIGS. 4, 5) is provided with a baseplate 18, 18I, a first side plate 16, 16I extending from a first bent portion 18a, 18aI of the baseplate 18, 18I, and a second side plate 17, 17I extending from a second bent portion 18b, 18bI of the baseplate 18, 18I.

Figure 2:
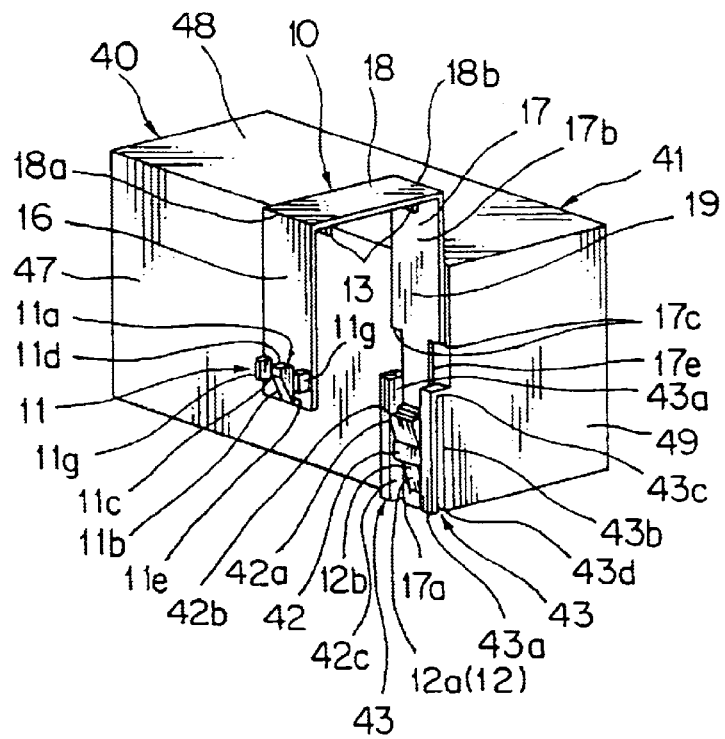
FIG. 2 is a perspective view showing a state of a clip attached to a second mating attachment body.
Figure 6:
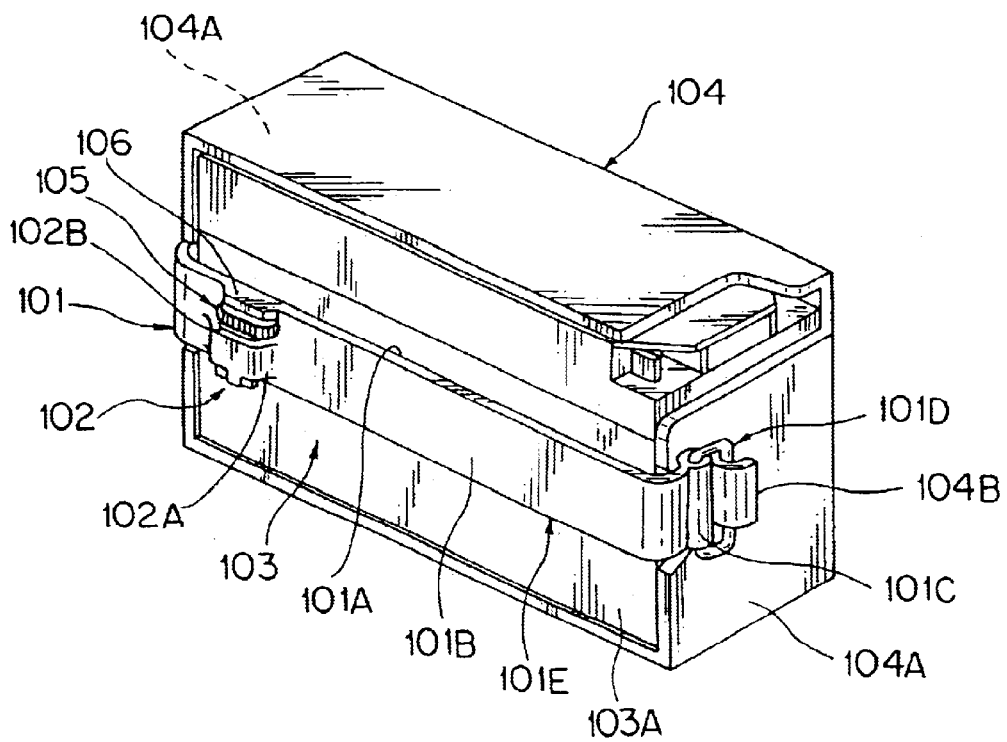
FIG. 6 is a perspective view showing a prior art attaching structure of a battery band.

The clip 10 shown in FIG. 1–FIG. 3 is in a U-shape and has a receiving portion 19 for receiving the relay 20. The second side plate 17I of the clip 10I shown in FIG. 4 and FIG. 5 functions as a hooking portion 17I.

A locking portion 11, 11I (an engaging portion) is provided on the first side plate 16, 16I. Correspondingly to this locking portion 11, 11I, a locking-engaging portion 31 (an engagement portion) is provided on the sidewall 36 forming the peripheral wall 39 of the housing 30. The relay 20 is attached to the housing 30, and the clip 10 (FIG. 1, FIG. 3), 10I (FIG. 4, FIG. 5) is attached to the housing 30, whereby the relay 20 is fixed to the housing 30 as shown in FIGS. 3 and 5.

With the above structure, various shapes of relays can be secured to the housing 30.

The relay 20 is secured to the housing 30 by engaging the locking portion 11, 11I of the clip 10, 10I with the locking-engaging portion 31 of the housing 30. The clip 10 shown in FIG. 1–FIG. 3 is made of synthetic resin. Specifically, the clip 10 may be made of polybutylene terephthalate resin which is superior in mechanical strength, heat resistance, injection molding property. The engaging projection 11a of the clip 10 shown in FIG. 1 and FIG. 2 has an inclined slide plane 11b, a slide plane 11c, an engaging plane 11d, and a pair of side faces 11e integrally with the first side plate 16 made of synthetic resin.

The clip 10I shown in FIG. 4 and FIG. 5 is formed of thin cold rolled steel plate. An engaging projection 11aI of the clip 10I is formed by means of the stamping and the bending on the first side plate 16I. With the stamping and the bending, a stamped opening 11fI is formed on the first side plate 16I of the clip 10I. The locking portion 11I shown in FIG. 4 has an engaging recess 11dI.

The engaging projection 11aI has a root portion 11aL, a bent portion 11aT, an inclined slide portion 11bI, another bent portion 11aV, and a slide portion 11cI.

When the locking portion 11I of the clip 10I shown in FIG. 4 engages the locking-engaging portion 31 of the housing 30, a pair of side faces 11eI of the engaging projection 11aI abut respective inside surfaces 31e of a pair of locking arms 31a.

As shown in FIG. 1, FIG. 3–FIG. 5, the locking-engaging portion 31 (an engagement portion) is provided with the locking arm 31a. Referring to FIG. 1 and FIG. 4, an accommodating space 31k is formed between the sidewall 36 and the locking arm 31a, and the accommodating space 31k receives the first side plate 16, 16I of the clip 10 (FIG. 1, FIG. 3), 10I (FIG. 4, FIG. 5).

As shown in FIG. 1 and FIG. 4, the locking arm 31a has a root portion 31m, a pair of arms 31h, an operating portion 31i, and an engagement recess 31j. The locking arm 31a also has an inclined slide plane 31b, a slide plane 31c, an engagement plane 31d, an inside surface 31e, an outside portion 31g, and a slanting plane 31f (FIG. 4).

A groove 31n with almost the same width as that of the engagement recess 31j of the locking arm 31a is provided on the sidewall 36 on which the locking arm 31a is provided. The housing 30 having the locking arm 31a is made of synthetic resin with resilience.

The locking portion 11 of the clip 10 shown in FIG. 1 engages the locking-engaging portion 31 of the housing 30 as follows. The clip 10 is downwardly pushed toward the housing 30 after the locking portion 11 of the clip 10 faces the locking-engaging portion 31 of the housing 30. Firstly, the inclined slide plane 11b of the engaging projection 11a of the clip 10 abuts the inclined slide plane 31b of the locking arm 31a of the housing 30.

The clip 10 is further pushed downward. The engaging projection 11a of the clip 10 passes under the operating portion 31i of the locking arm 31a of on the housing 30. The locking arm 31a is bent outwardly of the housing 30.

Further, the slide plane 11c of the engaging projection 11a of the clip 10 slides under the slide plane 31c of the locking arm 31a of the housing 30.

Still further, the engaging projection 11a of the clip 10 gets into the engagement recess 31j of the locking arm 31a of the housing 30. Finally, the engaging plane 11d of the engaging projection 11a meets the engagement plane 31d of the locking arm 31a, and the clip 10 securely engages the housing 30, while fixing the relay 20 as shown in FIG. 3.

On the contrary, when the clip 10 is detached from the housing 30, the locking arm 31a is bent outwardly by hooking a finger or a jig (not shown) on the inclined slide plane 31b of the operating portion 31i of the locking arm 31a until the engagement plane 31d (FIG. 1) of the locking arm 31a disengages from the engaging plane 11d (FIG. 1) of the engaging projection 11a. And then, the clip 10 is pulled up.

The locking portion 11I of the clip 10I shown in FIG. 4 engages the locking-engaging portion 31I of the housing 30 as follows. The clip 10I is downwardly pushed toward the housing 30 after the locking portion 11I of the clip 10I faces the locking-engaging portion 31I of the housing 30. Firstly, the inclined slide plane 11bI of the engaging projection 11aI of the clip 10I abuts the inclined slide plane 31b of the locking arm 31a of the housing 30.

The clip 10I is further pushed downward. The engaging projection 11aI of the clip 10I passes under the operating portion 31i of the locking arm 31a of on the housing 30. The locking arm 31a is bent outwardly of the housing 30.

Further, the slide plane 11cI of the engaging projection 11aI of the clip 10I slides under the slide plane 31c of the locking arm 31a of the housing 30.

Still further, the engaging projection 11aI of the clip 10I gets into the engagement recess 31j of the locking arm 31a of the housing 30. The operating portion 31i of the locking arm 31a gets into the engaging recess 11dI of the engaging projection 11aI of the clip 10I. As above, the clip 10I securely engages the housing 30, while fixing the relay 20 as shown in FIG. 5.

On the contrary, when the clip 10I shown in FIG. 5 is detached from the housing 30, the slide portion 11cI of the engaging projection 11aI of the clip 10I is downwardly bent by using a jig (not shown). The locking arm 31a is bent outwardly by hooking a finger or jig (not shown) on the inclined slide plane 31b of the operating portion 31i of the locking arm 31a until the engagement plane 31d (FIG. 4) of the locking arm 31a passes over the slide portion 11cI of the engaging projection 11aI. And then, the clip 10I is pulled up.

A pair of guide rib 11g, 11gI is provided on the first side plate 16, 16I of the clip 10, 10I so as to prevent the clip 10 (FIG. 1–FIG. 3), 10I (FIG. 4, FIG. 5) from laterally sliding with respect to the housing 30. The outside portions 31g of the locking arm 31a abut the inside surfaces of the guide ribs 11g, 11gI, and a position divergence, ie a displacement, of the clip 10, 10I relative to the housing 30 is prevented.

A pair of guide ribs 11g shown in FIG. 1 is integrally formed with the first side plate 16 made of synthetic resin. The guide ribs 11gI shown in FIG. 4 are formed by providing bent portions 11hI on the first side plate 16I.

Dimension-difference absorbing portions 13 (FIG. 1–FIG. 3), 13I (FIG. 4, FIG. 5) to absorb a difference in height between the relay 20 and another relay (not shown) project downward from the baseplate 18, 18I of the clip 10, 10I.

With the dimension-difference absorbing portions 13, 13I, another relay having a height slightly different from that of the relay 20 shown in FIG. 1, FIG. 3–FIG. 5 can be attached, and fixed, to the housing 30 by means of the clip 10, 10I.

Each dimension-difference absorbing portion 13 shown in FIG. 1–FIG. 3 is a projecting portion 13 which is molded integrally with the clip 10 of synthetic resin.

Each dimension-difference absorbing portion 13I shown in FIG. 4 and FIG. 5 functions as a spring portion, which pushes the ceiling wall 28 of the relay 20 (FIG. 5). The dimension-difference absorbing portion 13I as the spring portion produces an elastic force. When another relay, described above, is applied, the spring portion 13I can push it.

The spring portion 13I shown in FIG. 4 and FIG. 5 is formed with the stamping and the bending on the baseplate 18I of the clip 10I. When the spring portion 13I is formed, a receiving opening 13f to receive the spring portion 13I when bent is formed at the same time. The spring portion 13I made of metal has a root portion 13c, a bent portion 13d, a sloping portion 13b, another bent portion 13e, and a pushing portion 13a.

The second electric junction box 40 shown in FIG. 1–FIG. 3 has a body 41 in a block-shape, which body has a second engagement portion 42 and a second guide rib 43. The body 41 of the second electric Junction box 40 also has a peripheral wall 49 including a sidewall 47 and a ceiling wall 48. The second electric junction box 40 accommodates various electric and/or electronic devices.

The second engagement portion 42 and the second guide rib 43 are molded with synthetic resin having resilience integrally with the peripheral wall 49 forming the body 41 of the second electric junction box 40.

As shown in FIG. 1–FIG. 3, a pair of guide ribs 33 is provided on the housing 30, and a pair of guide ribs 43 relative to the above ribs 33 is provided on the second electric junction box 40. The housing 30 is attached to the second electric junction box 40 by engaging the guide ribs 33 with the guide ribs 43.

As shown in FIG. 1 and FIG. 4, each guide rib 33 provided on the peripheral wall 39 of the housing 30 has a projecting piece 33a with a bent end portion 33b. The projecting piece 33a and the bent end portion 33b are vertically formed, and the projecting piece 33a has a lower end portion 33d.

As shown in FIG. 1 and FIG. 2, each guide rib 43 provided on the peripheral wall 49 of the second electric junction box 40 has a body 43a with an outwardly-facing guide groove 43b.

Firstly, end portions 33c of the guide ribs 33 of the housing 30 are positioned near end portions 43d of the guide ribs 43, and then the bent end portions 33b of the guide ribs 33 are inserted into the guide grooves 43b of the guide ribs 43 until the end portions 33c of the bent end portions 33b of the guide ribs 33 abut groove end portions 43c of the guide grooves 43b of the second guide ribs 43.

Referring to FIG. 1 and FIG. 2, the guide ribs 43 also guide the second side plate 17 extending from the baseplate 18 of the clip 10. The guide ribs 43 also serve as a guide portion for the second side plate 17.

The second side plate 17 of the clip 10 has a wide portion 17b with the same width as the baseplate 18. A pair of step portions 17c is provided on the wide portion 17b. A small width portion 17a extends from the wide portion 17b. The small width portion 17a of the second side plate 17 formed on the clip 10 is inserted between the guide ribs 43 provided on the second electric junction box 40.

Also referring to FIG. 1 and FIG. 2, a second engaging portion 12 (a second locking portion) is provided on the second side plate 17 of the clip 10, and the second engagement portion 42 (the second locking-engaging portion) relative to the second locking portion 12 is provided on the second electric junction box 40.

A resilient engaging arm 12a is positioned in a receiving opening 12f provided on the small width portion 17a of the second side plate 17 of the clip 10. The resilient engaging arm 12a has an inclined slide plane 12b, a slanting plane 12c, an engaging plane 12d, and a pair of side faces 12e and is integrally formed with the second side plate 17 made of synthetic resin.

The second locking-engaging portion 42 provided on the sidewall 47 of the second electric junction box 40 has an engagement arm 42a, an operating portion 42b, an engagement recess 42c to receive the resilient engaging arm 12a provided on the small width portion 17a of the second side plate 17 of the clip 10, an engagement plane 42d, an insertion opening 42e into which the resilient engaging arm 12a of the small width portion 17a is inserted, a passing-through hole 42f continuing from the insertion opening 42e, and an exit 42g continuing from the passing-through hole 42f.

The locking portion 11 of the clip 10 engages the locking-engaging portion 31 of the housing 30 as shown in FIG. 1 and FIG. 3, and the second locking portion 12 of the clip 10 engages the second locking-engaging portion 42 of the second electric junction box 40 as shown in FIG. 1 and FIG. 3. That is, the clip 10 securely engages both the housing 30 and the second electric junction box 40.

When the locking portion 12 of the clip 10 shown in FIG. 1 is inserted in the second locking-engaging portion 42 of the second electric junction box 40, the side faces 17e of the small width portion 17a of the clip 10 abut the inside surfaces of the guide ribs 43, whereby a position divergence of the clip 10 relative to the second electric junction box 40 is prevented.

In order to detach the clip 10 from the second electric junction box 40 shown in FIG. 2, the operating portion 42b of the engagement arm 42a is pressed until the engaging plane 12d of the resilient engaging arm 12a (FIG. 1) disengages from the engagement plane 42d of the engagement arm 42a (FIG. 1), whereby the engagement state between the resilient engaging arm 12a and the engagement arm 42a is released.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A clip-attaching structure, comprising:

an attachment body;

a mating attachment body to which the attachment body is attached; and a clip, provided in accordance with an outer shape of the attachment body, with a baseplate, a first side plate extending from one side of the baseplate and having an engaging portion, and a second side plate extending from the other side of the baseplate, said clip fixing the attachment body to the mating attachment body, wherein an engagement portion to which the engaging portion engages is provided on the mating attachment body, the attachment body is fixed to the mating attachment body by fixing the clip to the mating attachment body, and said second side plate is free of an engaging portion for engaging an engagement portion on the mating engagement body for fixing the attachment body to the mating attachment body.

2. A clip-attaching structure comprising:

an attachment body;

a mating attachment body to which the attachment body is attached; and a clip, provided in accordance with an outer shape of the attachment body, with a baseplate, a first side plate extending from one side of the baseplate and having an engaging portion, and a second side plate extending from the other side of the baseplate, said clip fixing the attachment body to the mating attachment body, wherein an engagement portion to which the engaging portion engages is provided on the mating attachment body, the attachment body is fixed to the mating attachment body by fixing the clip to the mating attachment body, and a rib for preventing a displacement of the clip relative to the mating attachment body is provided on the first side plate of the clip.

3. The clip-attaching structure as set forth in claim 1, wherein the clip is provided with a dimension-difference absorbing portion for absorbing a dimensional difference between the attachment body and another attachment body when another attachment body having an outer dimension different from that of the attachment body is used in place of the attachment body.

4. A clip-attaching structure comprising:

an attachment body;

a mating attachment body to which the attachment body is attached; and a clip, provided in accordance with an outer shape of the attachment body, with a baseplate, a first side plate extending from one side of the baseplate and having an engaging portion, and a second side plate extending from the other side of the baseplate, said clip fixing the attachment body to the mating attachment body, wherein an engagement portion to which the engaging portion engages is provided on the mating attachment body, the attachment body is fixed to the mating attachment body by fixing the clip to the mating attachment body, the clip is provided with a dimension-difference absorbing portion for absorbing a dimensional difference between the attachment body and another attachment body when another attachment body having an outer dimension different from that of the attachment body is used in place of the attachment body, and the dimension-difference absorbing portion is formed as a spring portion which generates an elastic force when the dimension-difference absorbing portion is pressed against a wall of the attachment body.

5. A clip-attaching structure comprising:

an attachment body;

a mating attachment body to which the attachment body is attached; and a clip, provided in accordance with an outer shape of the attachment body, with a baseplate, a first side plate extending from one side of the baseplate and having an engaging portion, and a second side plate extending from the other side of the baseplate, said clip fixing the attachment body to the mating attachment body, wherein an engagement portion to which the engaging portion engages is provided on the mating attachment body, the attachment body is fixed to the mating attachment body by fixing the clip to the mating attachment body, a guide rib is provided on the mating attachment body, a second guide rib relative to the guide rib is provided on a second mating attachment body, and the second mating attachment body is attached to the mating attachment body with an engagement of the guide rib and the second guide rib.

6. The clip-attaching structure as set forth in claim 5, wherein the second mating attachment body is provided with a pair of second guide ribs, the second guide ribs serving as a guide portion to guide the second side plate extending from the baseplate of the clip.

7. The clip-attaching structure as set forth in claim 5, wherein a second engaging portion is provided on the second side plate of the clip, and a second engagement portion for the second engaging portion is provided on the second mating attachment body to which the clip is attached.

8. The clip-attaching structure as set forth in claim 1, wherein the clip is made of metal or resin.

9. A clip-attaching structure comprising:

an attachment body;

a mating attachment body to which the attachment body is attached; and a clip, provided in accordance with an outer shape of the attachment body, with a baseplate, a first side plate extending from one side of the baseplate and having an engaging portion, and a second side plate extending from the other side of the baseplate, said clip fixing the attachment body to the mating attachment body, wherein an engagement portion to which the engaging portion engages is provided on the mating attachment body, the attachment body is fixed to the mating attachment body by fixing the clip to the mating attachment body, the attachment body is a relay, and the mating attachment body is a housing formed on a cover of an electric junction box.

10. The clip-attaching structure as set forth in claim 5, wherein the second mating attachment body is an electric junction box.

11. The clip-attaching structure as set forth in claim 6, wherein the second mating attachment body is an electric junction box.

12. The clip-attaching structure as set forth in claim 7, wherein the second mating attachment body is an electric junction box.

* * * * *